United States Patent [19]
Kuga

[11] 4,174,500
[45] Nov. 13, 1979

[54] SCALE PLATE FOR MEASURING INSTRUMENTS

[75] Inventor: Yasuo Kuga, Mitaka, Japan

[73] Assignee: Kabushiki Kaisha Sanwa Denki Seisakusho, Tokyo, Japan

[21] Appl. No.: 838,541

[22] Filed: Oct. 3, 1977

Related U.S. Application Data

[63] Continuation of Ser. No. 663,681, Mar. 4, 1976, abandoned.

[30] Foreign Application Priority Data

Mar. 15, 1975 [JP] Japan .................................. 50-34149

[51] Int. Cl.² .......................... G01R 15/08; G02F 1/13
[52] U.S. Cl. .................................... 324/115; 313/500; 313/517; 350/336
[58] Field of Search ............... 324/115; 350/331, 336; 313/510, 513, 517, 500

[56] References Cited

U.S. PATENT DOCUMENTS

| 3,689,835 | 9/1972 | Bickfrod | 324/115 |
| 3,781,080 | 12/1973 | Aftergut | 324/115 |
| 3,978,404 | 8/1976 | Friend | 324/115 |

FOREIGN PATENT DOCUMENTS

| 216584 | 6/1956 | Australia . |
| 260826 | 1/1963 | Australia . |
| 1798986 | 10/1959 | Fed. Rep. of Germany . |
| 1181435 | 11/1964 | Fed. Rep. of Germany . |
| 2141146 | 3/1973 | Fed. Rep. of Germany . |

*Primary Examiner*—Rudolph V. Rolinec
*Assistant Examiner*—Ernest F. Karlsen
*Attorney, Agent, or Firm*—Norbert P. Holler

[57] ABSTRACT

A plurality of measurement readout displays electrically insulated from one another are provided on a plate member, each of which displays is performed by making use of an excitable material which is capable of being visible only upon the application of a voltage thereto.

10 Claims, 13 Drawing Figures

SCALE PLATE FOR MEASURING INSTRUMENTS

This is a continuation of application Ser. No. 663,681 filed Mar. 4, 1976, now abandoned.

The present invention relates to a scale plate for measuring instruments, or more in particular to a scale plate for measuring instruments so arranged that a desired one of multiple scales arrangements comprising a scale having displayable alphanumerics and/or numerics and/or characters, such as arrow, triangle, dot, star, etc., may be selectively indicated for the values assigned to the scale marks.

In conventional multiple-scale plates used as dials or indicating panels of various measuring instruments, several kinds of scale arrangements having alphanumerics and/or numerics and/or characters, such as arrow, triangle, dot, star, etc., are marked together on the same surface of a single plate. In actual practice, a desired one of the multiple scales arrangements is required to be selectively read from such a multiple-scale plate. This is not only inconvenient but often leads to the disadvantage of erroneously reading a different scale arrangement. Also, it is sometimes necessary for the operator to take a suitable character with respect to the numeral value marked on the scale plate, thus contributing to an occasional digital error made by the operator. Further, the fact that a plurality of kinds of measuring units exist on the scale plate causes the operator to sometimes confuse one measuring unit with another.

An object of the present invention is to provide a novel scale plate for measuring instruments which overcomes the above-mentioned disadvantages.

According to the present invention, there is provided a scale plate for measuring instruments comprised of a plurality of electrically-insulated measurement readout displays on a plate member, each of which displays is made of an excitable material which is capable of being visible only upon the application of a suitable voltage thereto.

The above and other objects, features and advantages will be made apparent by the detailed description taken in conjunction with the accompanying drawings, in which.

Figure 1:
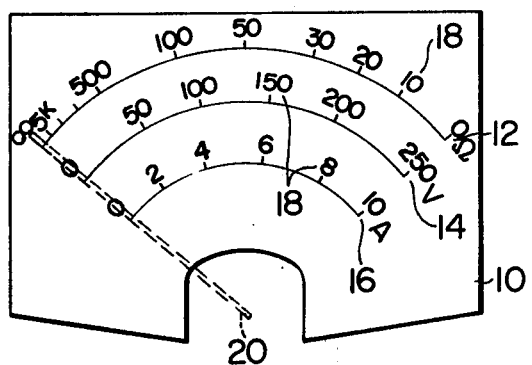
FIG. 1 is a plan view showing an example of conventional scale plates marked with multiple scales arrangements.

In conventional scale plates of multiple indication used with various kinds of measuring instruments, several kinds of scale arrangements having alphanumerics and/or numerics and/or characters marked on the surface of a single plate. Referring to FIG. 1 showing an example of such a scale plate, reference numeral 10 shows a plate member, numerals 12, 14 and 16 scale arrangements visibly marked on the surface of the plate member 10 in print or the like, of which numeral 12 shows a resistance scale arrangement, numeral 14 a voltage scale arrangement and numeral 16 a current scale arrangement. Each of the scales arrangements is marked in the same manner with numeral values/characters 18 at its appropriate scale mark, thus facilitating the reading of the scale. In addition to these scales arrangements, a capacitance scale arrangement, a decibel scale arrangement or the like is usually employed as desired to constitute multiple scales arrangements but not shown in the drawing for convenience of explanation. Numeral 20 shows a pointer.

The measuring instrument with such a scale plate is used in such a manner that the operator remembers the scale arrangement to which switchover has been made to read the deflection of pointer 20 along the particular scale arrangement. Due to the presence of a plurality of scales arrangements on the same surface of a plate member, however, a reading error tends to occur or the intended scale arrangement is not read easily as described above.

The present invention has been made in order to obviate the above-mentioned disadvantages. According to the invention, a display technique due to an excitable material which is capable of being visible upon the application of a suitable voltage, such as liquid crystal, plasma, a light-emitting diode, is utilized to cause only the scale arrangement having alphanumerics and/or numerics and/or characters of the required range to appear on the surface of the plate member, while at the same time keeping the other scales arrangements invisible. The present invention will be described more in detail below with reference to the accompanying drawings.

Figure 2:
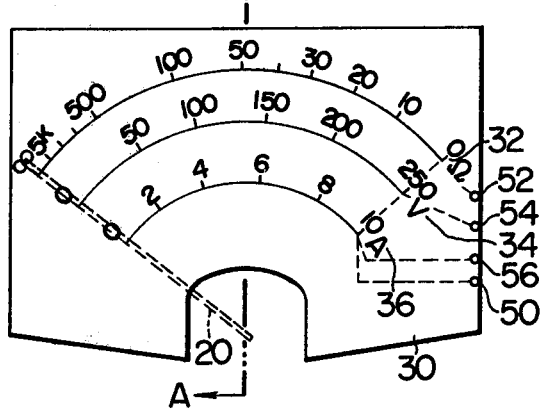
FIG. 2 is a plan view showing an embodiment of the present invention.
Figure 3:
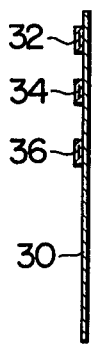
FIG. 3 is a cross-sectional view taken in the line A—A in FIG. 2.
Figure 4:
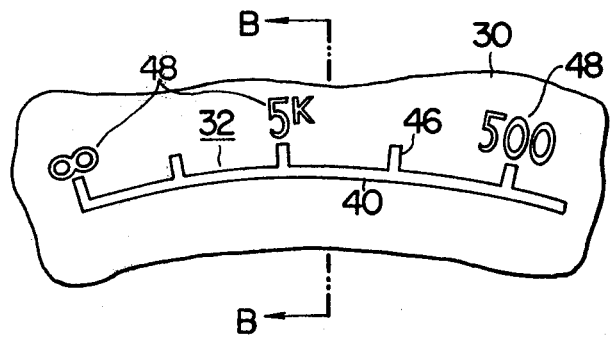
FIG. 4 is an enlarged plan view showing part of the embodiment of FIG. 2.
Figure 5:
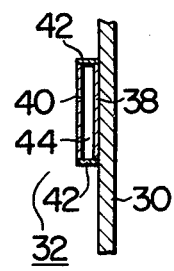
FIG. 5 is a cross-sectional view taken in the line B—B in FIG. 4.

In FIGS. 2 and 3 showing an embodiment of the invention, a resistance scale arrangement 32, a voltage scale arrangement 34 and a current scale arrangement 36 are provided on the surface of a plate member 30. But, these scales arrangements are invisible unless they are actuated. The construction of the respective scale arrangements is similar to each other and as an example, an enlarged view of the resistance scale arrangement 32 is shown in FIGS. 4 and 5. In FIG. 5, numeral 38 shows a lower electrode formed on the plate member 30. A transparent electrode 40 forming a pattern for the scale arrangement is provided in opposition to and electrically insulated by means of a suitable side wall of insulating material 42, from the lower electrode 38. In this embodiment, liquid crystal 44 is filled between the lower electrode 38 and the transparent electrode 40. As shown in FIG. 4, the transparent electrode 40 is formed in such a manner as to entirely cover the scale arrangement 32. The scale arrangement 32 comprises a scale having displayable alphanumerics and/or numerics and/or characters 48 designating the values assigned to the scale marks 46. Upon the application of a suitable voltage between the transparent electrode 40 and the lower electrode 38, therefore, the scale marks 46 and the alphanumerics and/or numerics and/or characters 48 are illuminated as if emitting light. The liquid crystal display itself is well known and will not be described here. The voltage scale arrangement 34 and the current scale 36 may be constructed in the same way. A common terminal 50 taken out of lower electrodes for the respective scales arrangements and terminals 52, 54 and 56 led from respective transparent electrodes 40 are provided at the side edge of the plate member 30 as shown in FIG. 2.

Figure 6:
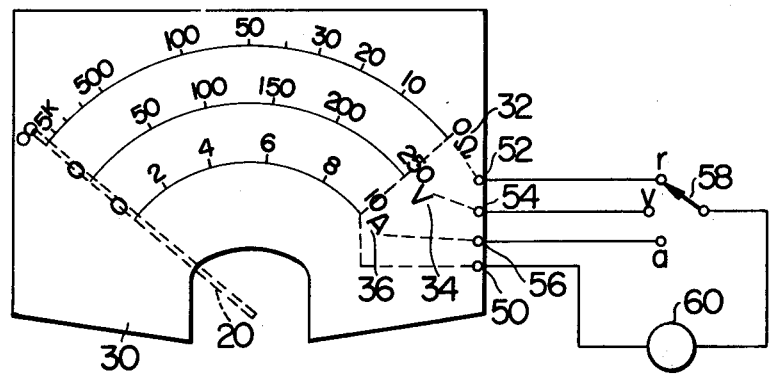
FIG. 6 is a diagram for explaining the operating modes of the scale plate according to the present invention.

In operation, a connection is established in such a manner as shown in FIG. 6 to apply a voltage from a power supply 60 between the lower electrode 38 and the transparent electrode 40 through a change-over switch 58. For resistance measurement, for instance, the change-over switch 58 is closed at the content r, thus causing only the resistance scale arrangement 32 to appear in colored illumination with the invisible state of the other scale arrangements. As a result, the deflection of the pointer 20 can be read very easily and accurately. This is also the case with the other scale arrangements. Namely, by changing over the switch 58 to alternatively close the contacts v and a the voltage and current scale arrangements may be selectively and alternatively displayed.

Figure 7:
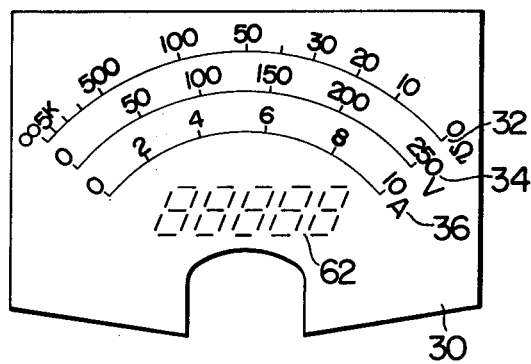
FIG. 7 is a plan view showing another embodiment of the invention.

Another embodiment of the invention is shown in FIG. 7. In this embodiment, a scale plate 30 has a digital scale arrangement 62 in addition to such analog scale arrangements as mentioned above. The digital scale arrangement 62 may be composed of a 7-segment digit indication such as used in miniature electronic computers and digital measuring instruments. This construction conveniently makes possible the application of mass-produced scale plates for dual purpose of analog and digital displays.

In place of the lower electrodes 38 separately provided for the respective scale arrangements in the above-mentioned embodiments, a conductor plate common to all the scale arrangements may be used. In this case, the plate member 30 may be used as a conductor plate to double as the lower electrode 38 without employing an insulating plate. Also, the common terminal 50 on the plate member 30 may be replaced by individual terminals. Further, the respective terminals 50, 52, 54 and 56 may be eliminated by taking out lead wires directly.

Figure 8A:
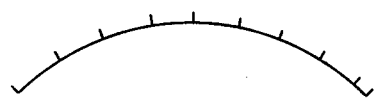
FIGS. 8A to 8D are diagrams showing various scales arrangements used according to the present invention.
Figure 8B:
Figure 8C:
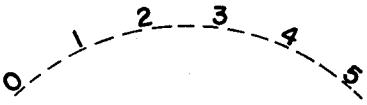
Figure 8D:
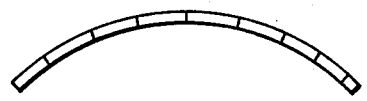

The scale arrangement according to the invention does not necessarily include displayable alphanumerics and/or numerics and/or characters. It may be such a mere scale arrangement as shown in FIG. 8A. In this case the alphanumerics and/or numerics and/or characters may be printed on the plate member 30 in advance. Also, the scale arrangement may be a plurality of dots as shown in FIG. 8B and may alternatively be a plurality of numerals as shown in FIG. 8C. In these cases of FIGS. 8B and 8C, the dotted line in each scale arrangement represents a lead wire for conduction. Such a scale arrangement as shown in FIG. 8D may also be used as a modification of the scale arrangement shown in FIG. 8A.

Figure 9:
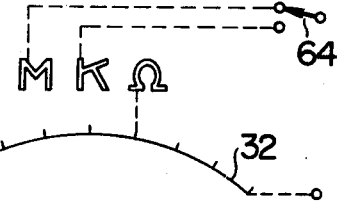
FIG. 9 is a diagram for explaining an example of unit switch-over on a scale arrangements.

A further embodiment of the invention is shown in FIG. 9. In this embodiment, unit of magnitude indications are changed by switching the ranges. In the case of resistance scale arrangement as shown in the drawing, for example, the resistance scale arrangement 32 remains as it is, while the indication of the unit of magnitude K and M may be alternatively selected by the operation of the change-over switch 64. The chance of the operator taking a wrong unit of magnitude is thus reduced. The same can be said of the voltage and current and other units of magnitude. The dotted line in FIG. 9 shows a lead wire for conduction.

Figure 10:
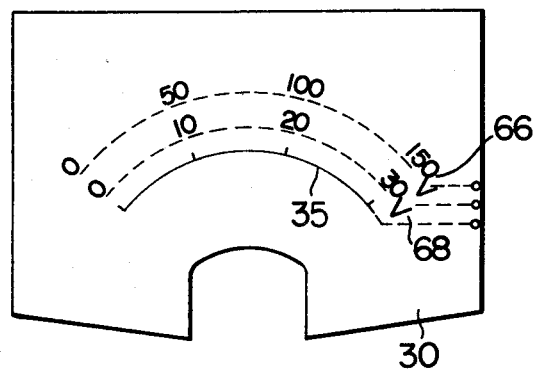
FIG. 10 shows an example of the switch-over of numeral values applied to a single scale arrangements.

Still another embodiment of the invention is shown in FIG. 10. Reference numeral 35 shows, say, a voltage scale arrangement and, numerals 66 and 68 show numeral values in two different ranges for the voltage scale arrangement 35. In this embodiment, the numeral value 66 and 68 are selectively and alternatively changed over by a change-over switch for selective display of desired one range with the voltage scale arrangement 35. In this case, the voltage scale arrangement 35 may be printed on the plate member 30 without using any liquid crystal, whereas displaying only the numeral value 66 and 68 with liquid crystal which may be alternatively selected by a change-over switch in such a manner mentioned above.

In this way, the present invention may be applied with equal effect to a scale plate carrying a single scale arrangement with a plurality of ranges.

It will be understood from the foregoing description that according to the invention each of multiple scales arrangements or each of multiple ranges of a single scale arrangement is independently constructed by an excitable material which is capable of being visible only upon the application of a suitable voltage, such as liquid crystal, plasma or light-emitting diode. In operation, only the liquid crystal, plasma or the light-emitting diode, as the case may be, associated with the appropriate scale arrangement of alphanumerics and/or numerics and/or characters is excited with a suitable voltage through a switching means. Thus the scale arrangement of alphanumerics and/or numerics and/or characters selected is displayed while preventing the others from presenting themselves, thereby enabling the operator to read a measurement accurately and easily within a short time.

As seen from the above, the display techniques according to the invention making use of an excitable material which is capable of being visible upon the application of a suitable voltage, such as liquid crystal, plasma or light-emitting diode are applied to both multiple and single scale arrangements for easily and selectively displaying one of scale arrangement of alphanumerics and/or numerics and/or characters as desired, resulting in a greatly improved utility of the scale plate. The scale plate according to the invention is thus expected to find wide application to the dials or indicating panels of various analog measuring instruments of this kind.

Various modifications may be made by one skilled in the art to the disclosed embodiments of this invention without departing from the scope of the invention as defined by the claims.

What is claimed is:

1. A scale plate having a plurality of scale arrangements for use with an electrical measuring instrument, the instrument having a changeover switch for selecting one of the plurality of scale arrangements and a pointer which is pivotably supported to indicate on the selected scale arrangement the electrical measurement in an analog manner, the scale plate comprising plural displaying means for selectively displaying each of the scale arrangements, each of the plural displaying means being separately disposed on a plate member, each of the displaying means having a voltage excitable material contained within a chamber formed from a transparent front electrode means spaced from a rear electrode disposed on the plate member and a continuous insulating side wall joining the transparent front electrode means and the rear electrode, the front electrode means including the scale arrangement, the scale arrangement being an arcuate scale having alphanumerics and/or numerics and/or characters designating values assigned to scale marks, whereby one of the plurality of scale arrangements can be selectively rendered visible to the exclusion of the remaining scale arrangements by applying a voltage between the front electrode means and the rear electrode of one of said plural displaying means selected in accordance with the position of the changeover switch.

2. A scale plate according to claim 1 further comprising a plurality of terminals for connecting said rear electrode and said front electrode means to an external voltage source.

3. A scale plate according to claim 2 in which said terminals for said respective rear electrode are commonly provided as a single terminal.

4. A scale plate according to claim 1 in which said rear electrode and said marks are commonly provided as a single electrode.

5. A scale plate according to claim 1, in which a single scale arrangement is located on said front electrode means.

6. A scale plate according to claim 1, further comprising auxiliary numerals and auxiliary marks, each of said auxiliary numerals and said auxiliary marks being formed on said plate member in the same manner as that constituting the scale arrangement, said auxiliary numerals and said auxiliary marks being selectively rendered visible by applying a voltage across the excitable material thereof in accordance with selected position of said changeover switch so that the measured result is enabled to be read out from said selectively excited auxiliary numerals and marks in a digital manner.

7. A scale plate according to claim 1, in which said front electrode means and said rear electrode are selectively connected to an external voltage source through said changeover switch.

8. A scale plate according to claim 1 in which the excitable material is a liquid crystal.

9. A scale plate according to claim 1 in which the excitable material is a plasma.

10. A scale plate according to claim 1 in which the excitable material is a light-emitting diode.

* * * * *

UNITED STATES PATENT AND TRADEMARK OFFICE
CERTIFICATE OF CORRECTION

PATENT NO. : 4,174,500
DATED : November 13, 1979
INVENTOR(S) : Yasuo Kuga

It is certified that error appears in the above-identified patent and that said Letters Patent are hereby corrected as shown below:

Column 5, line 23, for "electrode" read --electrodes--; same line, delete "and said marks". Column 6, lines 7-8, delete "that constituting".

Signed and Sealed this

Thirteenth Day of May 1980

[SEAL]

Attest:

Attesting Officer

SIDNEY A. DIAMOND

Commissioner of Patents and Trademarks